(12) United States Patent
Theuss (10) Patent No.: US 8,426,251 B2
(45) Date of Patent: Apr. 23, 2013

(54) SEMICONDUCTOR DEVICE (75) Inventor: Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 488 days.

(21) Appl. No.: 12/683,716

(22) Filed: Jan. 7, 2010

(65) Prior Publication Data

US 2011/0163440 A1 Jul. 7, 2011

(51) Int. Cl.
*H01L 21/00* (2006.01)
*H01L 23/48* (2006.01)
*H01L 23/52* (2006.01)
*H01L 29/40* (2006.01)

(52) U.S. Cl.
USPC ........... 438/113; 438/108; 438/109; 257/737; 257/E21.508; 257/E23.023

(58) Field of Classification Search .................. 438/613, 438/758, 113, 109; 257/737, E21.508, E23.023
See application file for complete search history.

(56) References Cited

U.S. PATENT DOCUMENTS

2007/0045841 A1* 3/2007 Cho et al. ........................ 257/737
2008/0191359 A1* 8/2008 Koller et al. ................... 257/773

* cited by examiner

*Primary Examiner* — Matthew Smith
*Assistant Examiner* — Wilner Jean Baptiste
(74) *Attorney, Agent, or Firm* — Dicke, Billig & Czaja, PLLC (57) ABSTRACT

A method of manufacturing a semiconductor device includes providing a carrier and attaching a plurality of semiconductor chips to the carrier. The semiconductor chips have a first electrode pad on a first main face and at least a second electrode pad on a second main face opposite to the first main face, whereby the first electrode pad is electrically connected to the carrier. A plurality of first bumps are formed on the carrier, the first bumps being made of a conductive material. The carrier is then singulated into a plurality of semiconductor devices, wherein each semiconductor device includes at least one semiconductor chip and one first bump.

18 Claims, 7 Drawing Sheets

SEMICONDUCTOR DEVICE

BACKGROUND

One aspect relates generally to semiconductor devices, and in one embodiment, to a method of manufacturing a semiconductor device that includes a semiconductor chip having a vertical structure, a carrier and at least two bumps made of a conductive material.

Semiconductor devices such as semiconductor packages include input/output terminals that are electrically connected to external circuitry to function as part of an electronic system. The semiconductor package typically includes the semiconductor chip, the terminals, electrical connections between chip contacts and the terminals and an encapsulant. The terminals extend through the encapsulant and are exposed to the external environment for electrical connection to a substrate such as a printed circuit board (PCB), and the encapsulant protects the chip from the external environment to ensure reliability and performance.

Semiconductor packages are often referred to as leaded or leadless packages. In leaded packages, the terminals (or leads) protrude from the encapsulant, whereas in leadless packages, the terminals are aligned with or recessed relative to the encapsulant. For instance, ball grid array (BGA) packages contain an array of solder bumps to post on corresponding metal traces on a printed circuit board, and land grid array (LGA) packages contain an array of contact pads that receive corresponding solder traces on a printed circuit board.

Further, a variety of techniques is used to electrically connect the semiconductor chip to the terminals, amongst them flip-chip bonding, wire bonding, wedge bonding, tape bonding etc.

Semiconductor packages must constantly reduce size and improve performance and reliability. Furthermore, improved methods of manufacturing a semiconductor device or package should provide high performance, high reliability, and low manufacturing cost.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

DETAILED DESCRIPTION

Aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. The following description is therefore not to be taken in a limiting sense, and the scope is defined by the appended claims. It should also be noted that the representations of the various layers, sheets or substrates in the figures are not necessarily to scale.

In the following detailed description, reference is made to the accompanying drawings, which form a part thereof, and in which is shown by way of illustration specific embodiments in which the invention may be practiced. In this regard, directional terminology, such as e.g. "upper", "lower", "top", "bottom", "left-hand", "right-hand", "front side", "backside", etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

The semiconductor chips described herein have a vertical structure, that is to say that the electric currents can flow in a direction perpendicular to the main surfaces of the semiconductor chips. A semiconductor chip having a vertical structure may have contact pads on its two main surfaces, that is, on its front side and backside.

The semiconductor chips described herein may be of different types, may be manufactured by different technologies and may include for example integrated electrical, electro-optical or electro-mechanical circuits and/or passives. The semiconductor chips may, for example, be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor chips may include control circuits, that is, logic integrated circuits to control the integrated circuits of the vertical semiconductor chip, microprocessors, or microelectromechanical components.

By way of example, in power MOSFETs having a vertical structure, the source electrode pad and the gate electrode pad of the power MOSFET may be situated on one main surface, while the drain electrode pad of the power MOSFET may be arranged on the other main surface. Likewise, in vertical power diodes, the anode electrode pad and the cathode electrode pad are arranged on opposite main surfaces of the power diode.

The semiconductor chips need not be manufactured from specific semiconductor material, for example Si, SiC, SiGe, GaAs, and, furthermore, may contain inorganic and/or organic materials that are not semiconductors, such as for example insulators, plastics or metals.

Furthermore, the semiconductor chips described herein include electrode pads (or contact pads) on both of their outer main surfaces wherein the electrode pads serve for electrically contacting the semiconductor chips or circuits integrated in the semiconductor chip. The electrode pads may have the form of lands, that is, flat contact layers on an outer surface of the semiconductor chip. Any desired metal or metal alloy, for example aluminum, titanium, gold, silver, copper, palladium, platinum, nickel, chromium or nickel vanadium, may generally be used as the material. The metal layers need not be homogenous or manufactured from just one material, that is to say various compositions and concentrations of the materials contained in the metal layers are possible.

A plurality of semiconductor chips and a plurality of first bumps being made of a conductive material are formed on the carrier. In one embodiment, the carrier may be made of a metal plate which may be flat and unstructured. In another embodiment, the carrier may be made of a plurality of layers, wherein the surface layer of the carrier may be a continuous, unstructured metal coating and one or more of the other layers may form a rigid structure made of a material such as ceramics, plastics etc.

The application of the first bumps on the carrier may be performed by printing techniques such as, for example, stencil printing, screen printing, ink jet printing. Other techniques for the application of the first bumps such as, for example, dispensing techniques are also possible. All these techniques likewise allow for the application of a small and controllable amount of bump material (for example, a polymer material filled with metal particles, a solder material etc.) on the upper surface of the carrier.

In one embodiment, second bumps being made of a conductive material are formed on the electrode pads on the top faces of the semiconductor chips. The same techniques as used to apply the first bumps may be used to apply the second bumps.

A dielectric material may be provided over the carrier and the semiconductor chips or at least parts of the semiconductor chips to form an encapsulant. The encapsulant may be made of any appropriate duroplastic, thermoplastic or thermosetting material or laminate (prepreg). The dielectric material which forms the encapsulant may contain a filler material. After its deposition, the dielectric material may be hardened by a heat treatment. Various techniques may be employed to form the encapsulant by the dielectric material, for example compression molding, transfer molding, injection molding, powder molding, liquid molding, dispensing or laminating.

FIGS. 1A-1D and 2A-2D are perspective and cross-sectional views, respectively, of a method of manufacturing a semiconductor package in accordance with a first embodiment of the present invention.

Figure 1A:
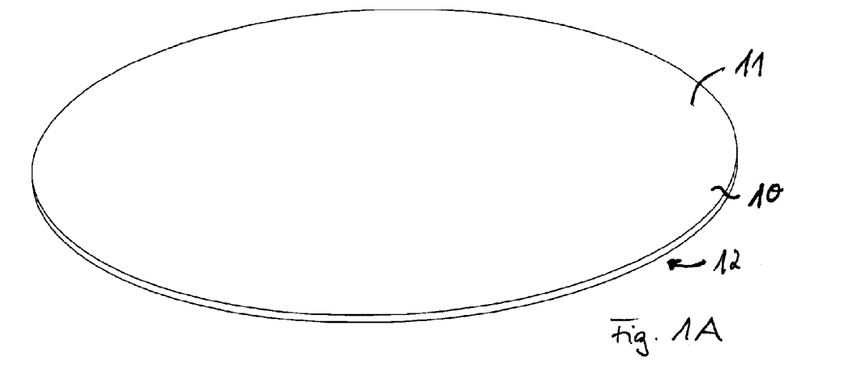
FIGS. 1A to 1D are perspective views schematically illustrating a method of manufacturing a semiconductor device in accordance with one embodiment.
Figure 2A:
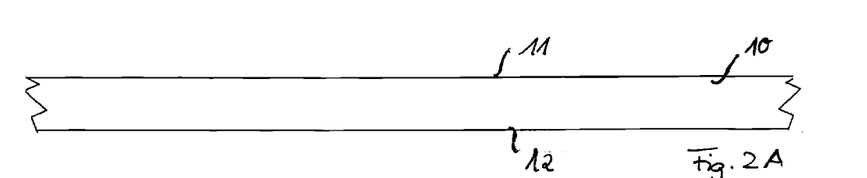
FIGS. 2A to 2D are cross-sectional views that correspond to FIGS. 1A to 1D, respectively.

FIGS. 1A and 2A illustrate a carrier 10 which may be a metal plate having opposing major upper and lower surfaces 11 and 12. The carrier 10 can be made of various metals such as Cu, Ni, Ag, Au, Al, Sn, and alloys thereof, for example, NiAu, NiPdAu, etc. In one embodiment, the carrier 10 may be made of a base layer made of, for example, ceramics, plastics etc. and a metal layer coated on the base layer and forming the upper surface 11 thereof. The metal layer may be made of the same materials as mentioned above in relation to a carrier when made of solid metal.

Typically, the upper surface 11 of the carrier 10 is electrically conductive and may be unstructured, that is, unpatterned, meaning that no conductive traces, lands etc. are designed therein.

The carrier 10 may have a thickness (between surfaces 11 and 12) of about less than 100 to about 2000 microns or even more. The lateral size of the carrier 10 may be, in one or two dimensions, greater than 0.2 or 0.3 m. The outline of the carrier 10 may have a circular or polygonal shape. The carrier 10 may be of a sheet-like, planar design. The dimensions of the carrier 10 may be similar to the dimensions of a conventional wafer, and thus, the carrier may be referred to as a "metal wafer".

Figure 1B:
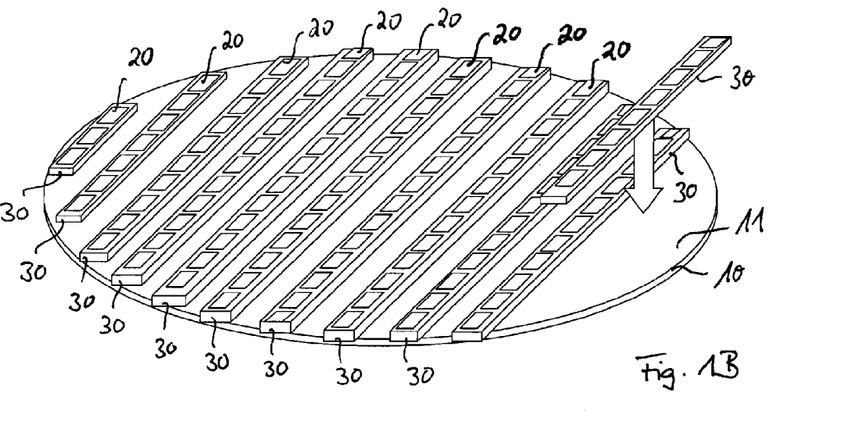
Figure 2B:
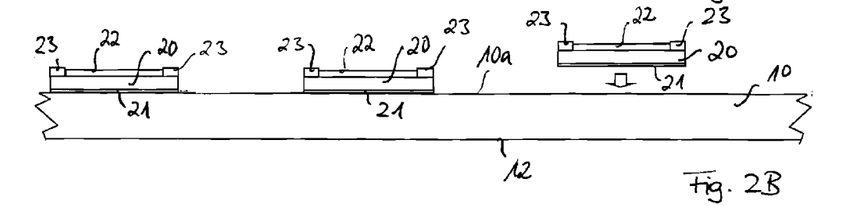

FIGS. 1B and 2B illustrate a step of attaching semiconductor chips 20 onto the upper surface 11 of the carrier 10. The semiconductor chips 20 may be arranged on the carrier 10 in groups of semiconductor chips 20 such as, for example, rows 30 of semiconductor chips 20. In one embodiment, the rows 30 of semiconductor chips 20 are integrally cut out of a semiconductor wafer and integral rows 30 of semiconductor chips 20 are placed on the carrier 10. In another embodiment, the semiconductor chips 20 are singulated and the singulated semiconductor chips 20 are placed on the carrier 10 to form groups such as, for example, rows 30 of (singulated) semiconductor chips 20. In both cases, the rows 30 of semiconductor chips 20 may be arranged in a parallel and spaced-apart relationship on the carrier 10 as illustrated in FIGS. 1B and 2B.

The semiconductor chips 20 may have at least a first electrode pad 21 on a lower main face and at least a second electrode pad 22 on an upper main face opposite to the lower main face. Further, a peripheral insulating barrier 23 may be provided on each semiconductor chip 20 to frame the second electrode pad 22.

The semiconductor chips 20 are bonded to the upper surface 11 of the carrier 10 via a bond layer (not illustrated) applied between the first electrode pads 21 of the semiconductor chips 20 and the upper surface 11 of the carrier 10. In one embodiment, the bond layer is made of solder. By way of example, diffusion solder may be used. AuSn, AgSn, CuSn, AgIn, AuIn, CuIn, AuSi, Sn or Au solders or other solder materials may be employed.

In one embodiment, the semiconductor chips 20 are bonded to the carrier 10 by using a bond layer of metal particles electrically contacting each other. It is possible to use electrically conductive adhesives which may be based on epoxy resins or other polymer materials and which are enriched with, for example, gold, silver, nickel or copper particles in order to provide for the electrical conductivity.

Further, a bond layer containing electrically interconnecting particles may be generated by either applying a so-called nano paste containing metal particles distributed in a vaporizable medium or by directly depositing metal particles. In both cases, a sintering process is then performed to produce a sintered metal particle bond layer.

Using diffusion solder, a conductive adhesive or sintered metal particles (either applied in a vaporizable medium or as bare particles) for bonding the semiconductor chips 20 to the upper surface 11 of the carrier 10 allow for generating a bond layer of small thickness. This is due to the specific properties of these materials and their application methods. More specifically, the diffusion solder material may be sputtered or galvanically deposited onto the first electrode pads 21 of the semiconductor chips 20 in a highly controllable manner such that only small amounts of material can be accumulated on the electrode pads 21. The paste containing metal particles (that is, conductive adhesive or nano paste) may be applied by a printing or dispensing technique to the electrode pads 21 of the semiconductor chips 20, and also these methods of application allow for the production of bond layers which have a thickness of less than, for example, 20 µm, 10 µm or even less than 5 µm.

Figure 1C:
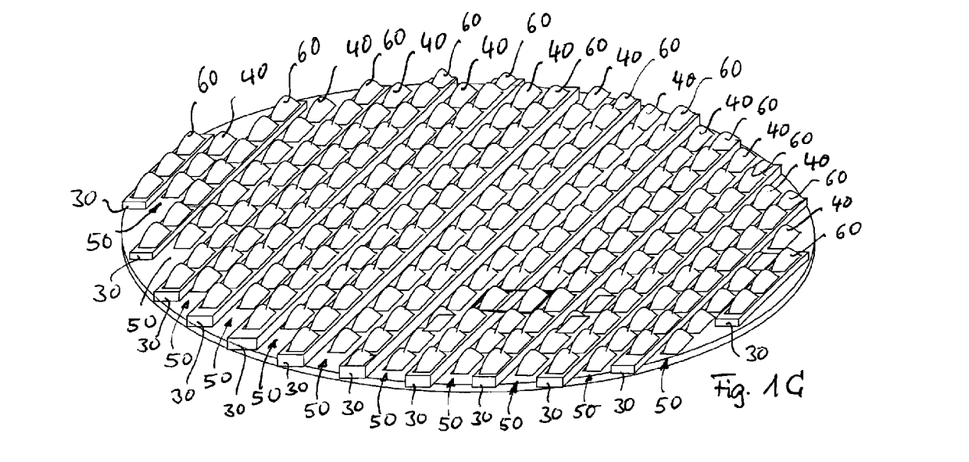
Figure 2C:
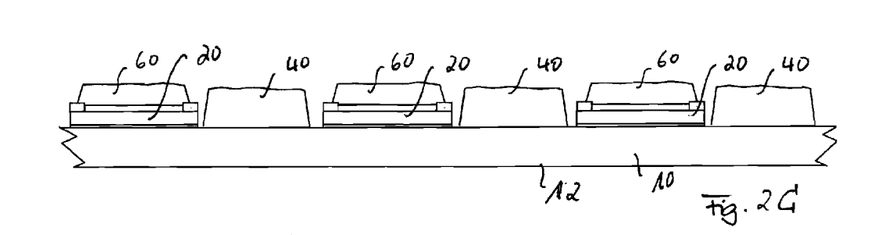

FIGS. 1C and 2C illustrate a step of forming first bumps 40 of a conductive material on the upper surface 11 of the carrier 10. The first bumps 40 may be arranged on the carrier 10 in groups of first bumps 40 such as, for example, rows 50 of first bumps 40. The rows 50 of first bumps 40 may be placed in the spaces between adjacent rows 30 of semiconductor chips 20, thereby forming an interleaved, multi-stripe arrangement of alternating rows 30 of semiconductor chips 20 and rows 50 of first bumps 40. Further, the first bumps 40 may be aligned with the semiconductor chips 20 in a lateral direction perpendicular to the extension of the parallel rows 30, 50 of semiconductor chips 20 and first bumps 40.

Further, second bumps 60 of a conductive material may optionally be formed on the second electrode pads 22 on the upper main faces of the semiconductor chips 20. The second bumps 60 may be applied at the same instant of time as the first bumps 40 and may be made of the same material as the first bumps 40. Further, the height of the second bumps 60 over the second electrode pads 22 may be smaller than the height of the first bumps 40 over the upper surface 11 of the carrier 10, and it may be provided that the heights of the first and second bumps 40, 60 are chosen to level the thickness of the bond layer (not illustrated) plus the thickness of the semiconductor chip 20. In this case, the summits of the first and second bumps 40, 60 are substantially on the same level, that is, are lying in one plane parallel to the plane defined by the carrier 10. In general, however, the first and second bumps 40, 60 can be formed simultaneously or sequentially, can be made of the same or different materials and can have the same or different elevation over the upper main surface 11 of carrier 10.

The application of the material (for example, solder paste or conductive polymer paste) forming the first and second bumps 40, 60 may be performed by stencil printing, screen printing, ink jet printing or other printing technologies. Other techniques for the application of the material forming the first and second bumps 40, 60 are also possible, for example dispensing.

By way of example, during stencil or screen printing, a stencil (not illustrated) is placed on carrier 10 and chips 20, stencil openings are aligned with the locations where the first and second bumps 40, 60 are to be formed, and then a squeegee (not illustrated) pushes the paste (for example, uncured epoxy with metal particles or solder paste) through holes ending in the stencil openings on the semiconductor chips 20 and into the spaces between the semiconductor chips 20. Different heights of the first and second bumps 40, 60 may be generated by using a stencil having holes of different geometries for the application of the first and second bumps 40, 60, for example, holes of different lengths and/or holes having openings of different areas. Thus, a coplanar carrier-bump structure may be generated as explained above.

By way of example, the semiconductor chips 20 may have a thickness as small as less than 200 µm, less than 100 µm or even less than 50 µm. Such thicknesses plus the thickness of the bond layer which is not depicted and, if optionally applied, plus the thickness of the second bumps 60 may easily be obtained by the first bumps 40.

Figure 1D:
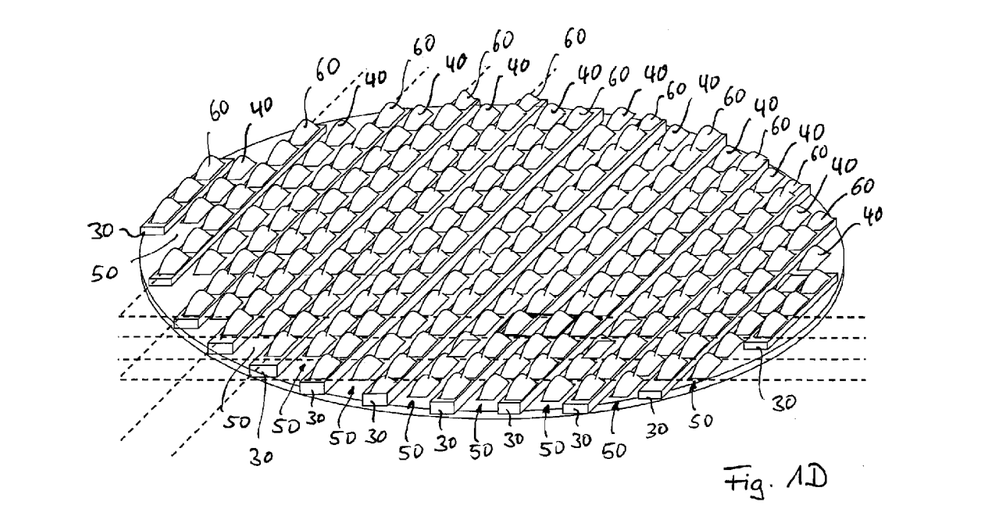
Figure 2D:
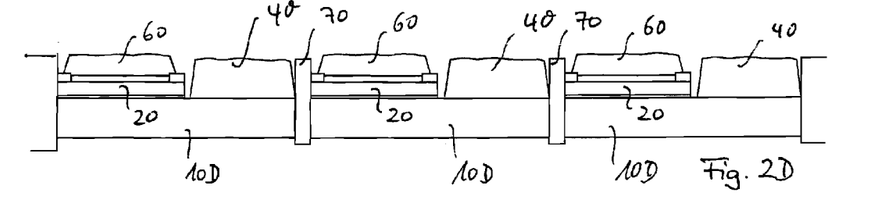

FIGS. 1D and 2D illustrate a step of singulating the carrier 10 into a plurality of semiconductor devices. Singulation may be performed by any dicing technique such as, for example, blade dicing (sawing), laser dicing etc. The semiconductor devices are singulated along dicing streets which are depicted in FIG. 1D by dashed lines and indicated in FIG. 2D by dicing blades 70. A first plurality of dicing streets may run parallel to rows 30, 50 of semiconductor chips 20 and first bumps 40, whereas a second plurality of dicing streets may run perpendicular to the first plurality of dicing streets.

A semiconductor device singulated that way may include one semiconductor chip 20, one first bump 40 and one device carrier 10D cut out of carrier 10. By way of example, such semiconductor devices are produced by using the mesh-like dicing streets as illustrated in FIG. 1D. In general, however, a semiconductor device produced that way may include one or more semiconductor chips 20, one or more first bumps 40 and the device carrier cut out of carrier 10 and serving as a mounting platform, current connection element and heat sink of the semiconductor device.

Figure 2E:
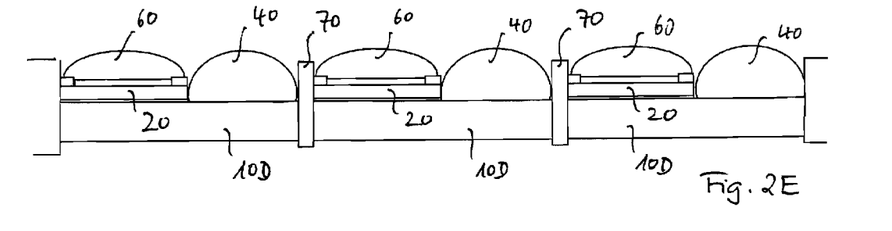
FIG. 2E is a cross-sectional view corresponding to FIG. 2D after a solder reflow operation.

FIG. 2E illustrates an optional step of applying a reshape process to obtain a desired shape of the first and second bumps 40, 60. For instance, if the first and second bumps 40, 60 are made of solder, a reflow process may be used. During reshaping, the (optional) insulating barrier 23 may assist to prevent electrical contact between the first and second bumps 40, 60.

It is to be noted that the order of the steps of applying the first and second bumps 40, 60, singulating the semiconductor devices and reshaping the bumps may be changed. By way of example, the orders (1) bump application, then reshaping, then singulating, or (2) bump application, then singulating, then reshaping, or (3) singulating, then bump application, then reshaping are feasible.

Figure 3:
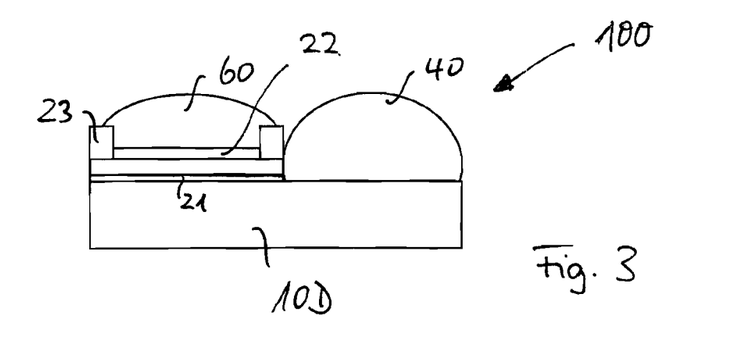
FIG. 3 is a cross-sectional view schematically illustrating a semiconductor device 100 in accordance with one embodiment.

FIG. 3 is a cross-sectional view schematically illustrating a semiconductor device 100 in accordance with one embodiment. The semiconductor device 100 may be manufactured in accordance with the method illustrated in FIGS. 1A to 2E. As explained above, the semiconductor device 100 may include a device carrier 10D, one semiconductor chip 20 bonded to the device carrier 10D via a bond layer (not illustrated) arranged between the device carrier 10D and the first electrode pad 21 of the semiconductor chip 20, one first bump 40 attached and electrically connected to the device carrier 10D and a second bump 60 attached and electrically connected to the second electrode pad 22 of the semiconductor chip 20. The first and second bumps 40, 60 form the terminals of the semiconductor device 100. It is to be noted that the semiconductor device 100 may be designed not to be provided with any encapsulant for final use.

Figure 4:
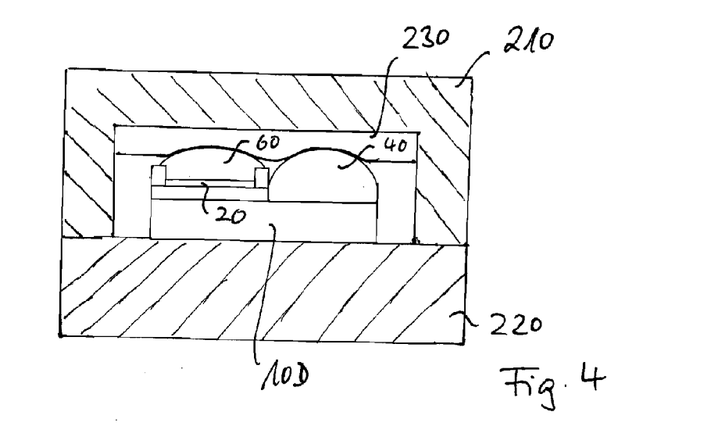
FIG. 4 is a cross-sectional view of the semiconductor device 100 placed in a mold tool.

According to one embodiment, the semiconductor device may be equipped with an encapsulant in order to protect the semiconductor device. FIG. 4 illustrates a closed mold tool comprising an upper mold half 210 and a lower mold half 220 defining a mold cavity. The upper mold half 210 is provided with an elastic cushion or film 230 extending at the ceiling of the mold cavity. The elastic cushion or film 230 is compressed and deformed by the first and second bumps 40, 60 when placed within the mold cavity.

An encapsulant may be deposited by transfer molding. Generally speaking, transfer molding involves forming components in a closed mold tool from a mold compound that is conveyed under pressure in a hot, plastic state from a central reservoir through runners and gates (not illustrated) into the mold cavity. The mold compound may be made of any appropriate duroplastic, thermoplastic or thermosetting material, for example, a resin material such as, for example, epoxy.

Figure 5:
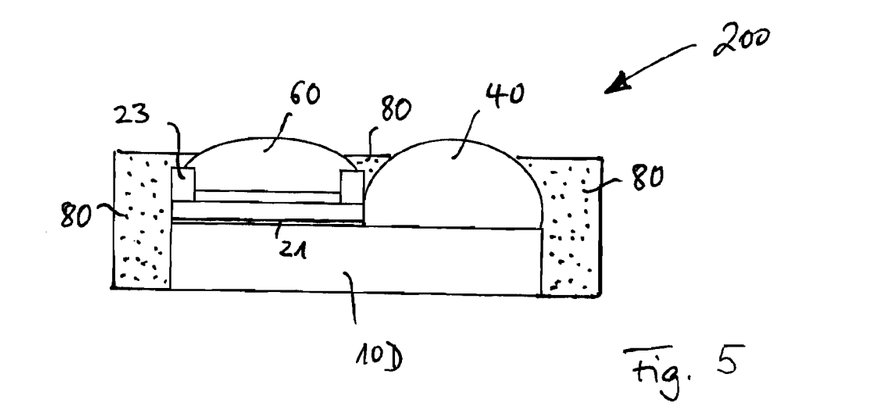
FIG. 5 is a cross-sectional view schematically illustrating a semiconductor device 200 in accordance with one embodiment.

FIG. 5 is a cross-sectional view schematically illustrating a semiconductor device 200 in accordance with one embodiment. The semiconductor device 200 may be manufactured by depositing an encapsulant 80 onto the semiconductor device 100 in the mold tool 210, 220. The encapsulant 80 contacts and extends along the side faces of the device carrier 10D and contacts and extends at least partly along the outer surfaces of the first and second bumps 40, 60. However, as a central part of each of the first and second bumps 40, 60 was covered by the elastic cushion or film 230 during molding, these central parts were not subjected to the encapsulant and thus remain exposed. The exposed parts of the first and second bumps 40, 60 may protrude over periphery of the encapsulant 80 and form the terminals of semiconductor device 200.

Figure 6:
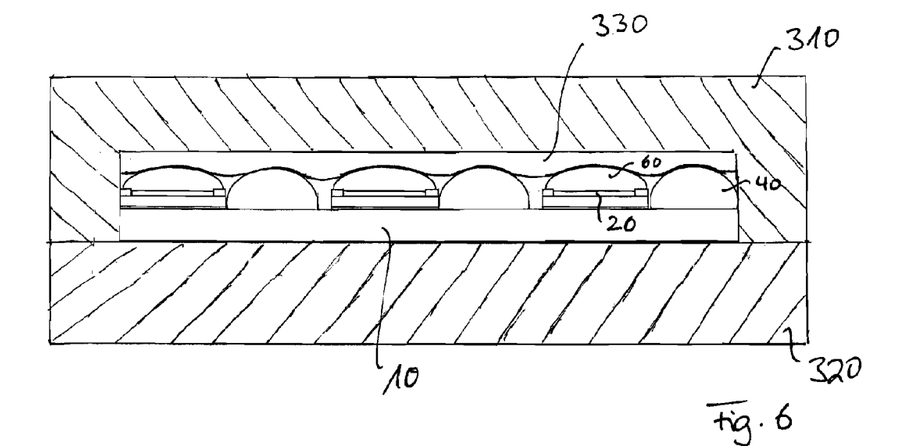
FIG. 6 is a cross-sectional view of a workpiece placed in a mold tool, the workpiece including chips and being suited for subsequent processing.

FIG. 6 illustrates a closed mold tool comprising an upper mold half 310 and a lower mold half 320 defining a mold cavity in accordance with one embodiment. Similar to mold tool 210, 220, the upper mold half 310 is provided with an elastic cushion or film 330 extending at the ceiling of the mold cavity.

A carrier 10 equipped with semiconductor chips 20 and first and second bumps 40, 60 is placed in the cavity of the mold tool 310, 320. The carrier 10 has not yet been cut into single semiconductor devices. Then, encapsulant 80 is simultaneously applied to all semiconductor chips 20 and first and second bumps 40, 60 arranged on the (integral) carrier 10. As a central part of each of the first and second bumps 40, 60 is covered by the elastic cushion or film 330 during molding, these central parts are not subjected to the encapsulant and thus remain exposed. To avoid reiteration, reference is made to the description in conjunction with the aforementioned embodiments.

After molding, the encapsulated carrier 10 may be singulated into single semiconductor devices. All dicing techniques and patterns as mentioned above may be used, and reference is made to the description in conjunction with FIGS. 1D and 2D.

Figure 7:
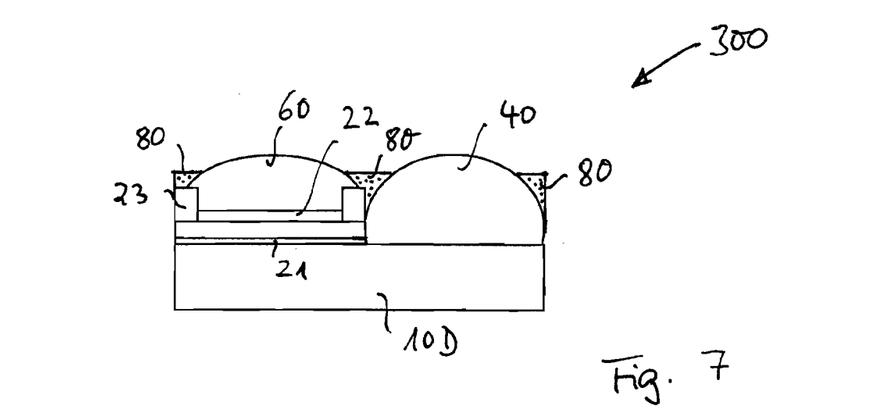
FIG. 7 is a cross-sectional view schematically illustrating a semiconductor device 300 in accordance with one embodiment.

FIG. 7 is a cross-sectional view schematically illustrating a semiconductor device 300 in accordance with one embodiment. The semiconductor device 300 may be manufactured by using the mold tool 310, 320 illustrated in FIG. 6. The encapsulant 80 contacts and extends at least partly along the outer surfaces of the first and second bumps 40, 60. However, due to the dicing operation, the encapsulant 80 does not extend along the side faces of the device carrier 10D, thus leaving the side faces of the device carrier 10D exposed.

Figure 8:
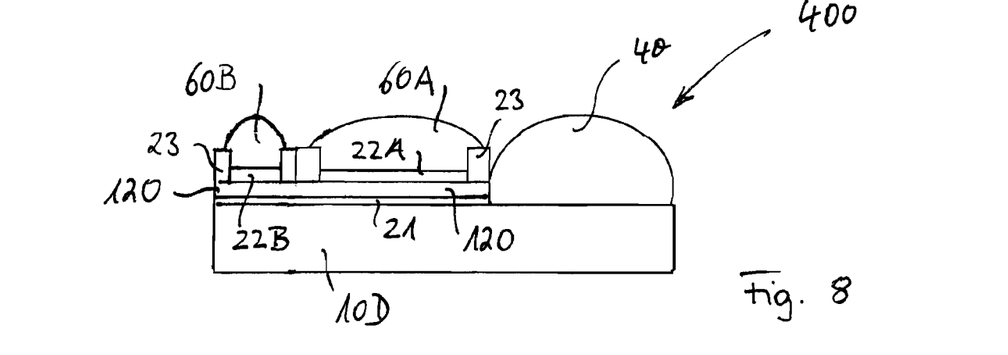
FIG. 8 is a cross-sectional view schematically illustrating a semiconductor device 400 in accordance with one embodiment.
Figure 9:
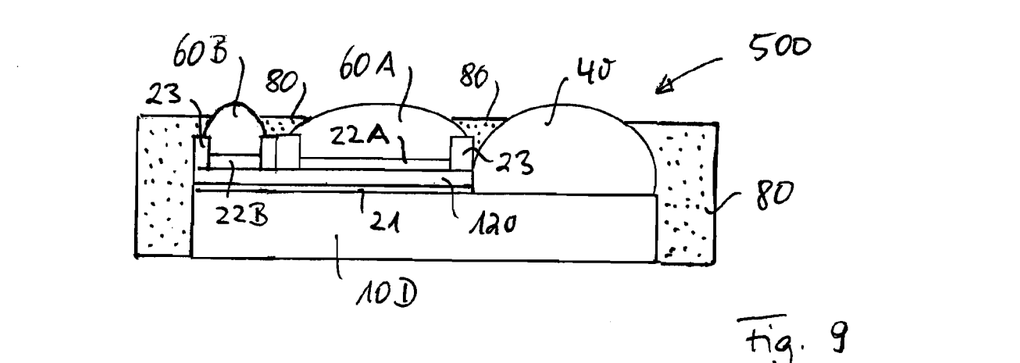
FIG. 9 is a cross-sectional view schematically illustrating a semiconductor device 500 in accordance with one embodiment.
Figure 10:
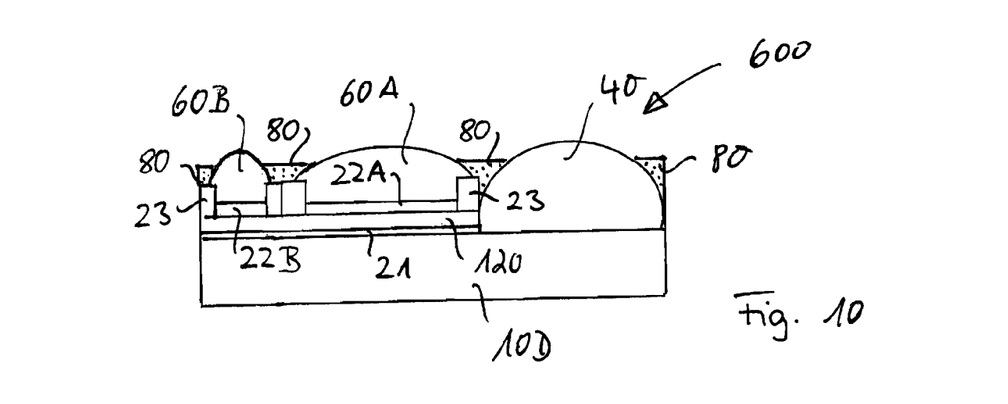
FIG. 10 is a cross-sectional view schematically illustrating a semiconductor device 600 in accordance with one embodiment.

FIGS. 8 to 10 are cross-sectional views schematically illustrating semiconductor devices 400, 500 and 600, respectively, in accordance with further embodiments.

In these embodiments, a semiconductor chip 120 is used that has one first electrode pad 21 provided at its lower main face and two second electrode pads 22A and 22B provided at its upper main face. The semiconductor chip 120 may, for example, be a transistor or power transistor such as, for instance, a MOSFET, IGBT or JFET. If the semiconductor chip 120 is a transistor or power transistor, reference sign 22A may denote the source electrode pad, reference sign 22B may denote the gate electrode pad and reference sign 21 may denote the drain electrode pad of the (power) transistor 120. The semiconductor chips 120 may have the same dimensions as the semiconductor chips 20.

The semiconductor device 400 may be designed and manufactured in the same way as the semiconductor device 100, with the only exception that semiconductor chip 120 is used instead of semiconductor chip 20 and that the two second bumps 60A and 60B are formed on the two second electrode pads 22A and 22B. The two second bumps 60A and 60B may be made of the same material, applied in the same fashion (for example, by printing), processed (for example, shaped) the same way and designed to have the same height as explained above with reference to the foregoing embodiments and, FIGS. 1A to 2D to which reference is made in order to avoid reiteration.

FIG. 9 is a cross-sectional view schematically illustrating a semiconductor device 500. Similar to semiconductor device 200, semiconductor device 500 is provided with an encapsulant 80. The semiconductor device 500 may be manufactured from semiconductor device 400 the same way as semiconductor device 200 has been described to be manufactured from semiconductor device 100. In view of the manufacturing method and the design of semiconductor device 500, reference is made to the description of the corresponding foregoing embodiments in order to avoid reiteration.

FIG. 10 is a cross-sectional view schematically illustrating a semiconductor device 600. Similar to semiconductor device 300, semiconductor device 600 is provided with an encapsulant 80. The semiconductor device 600 may be manufactured in a similar way as has been described in conjunction with semiconductor device 300 and the mold tool 310, 320 illustrated in FIG. 6. In view of the manufacturing method and the design of semiconductor device 600, reference is made to the description of the corresponding foregoing embodiments in order to avoid reiteration.

Figure 11:
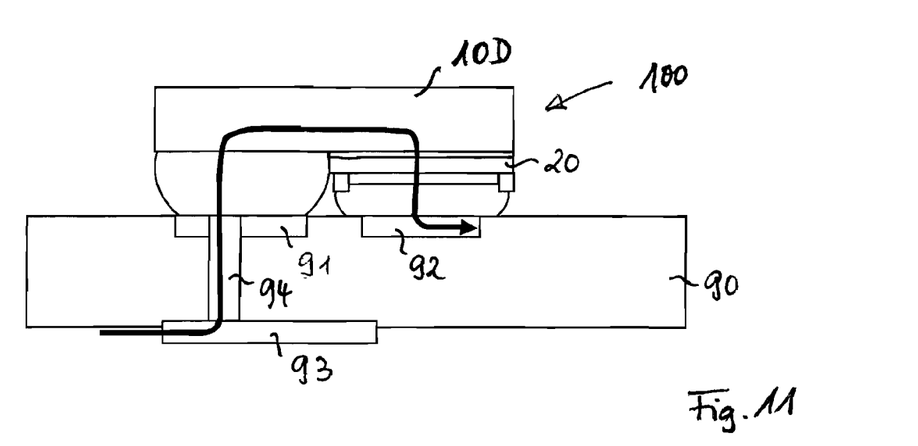
FIG. 11 is a cross-sectional view schematically illustrating the semiconductor device 100 bonded to a substrate.
Figure 12:
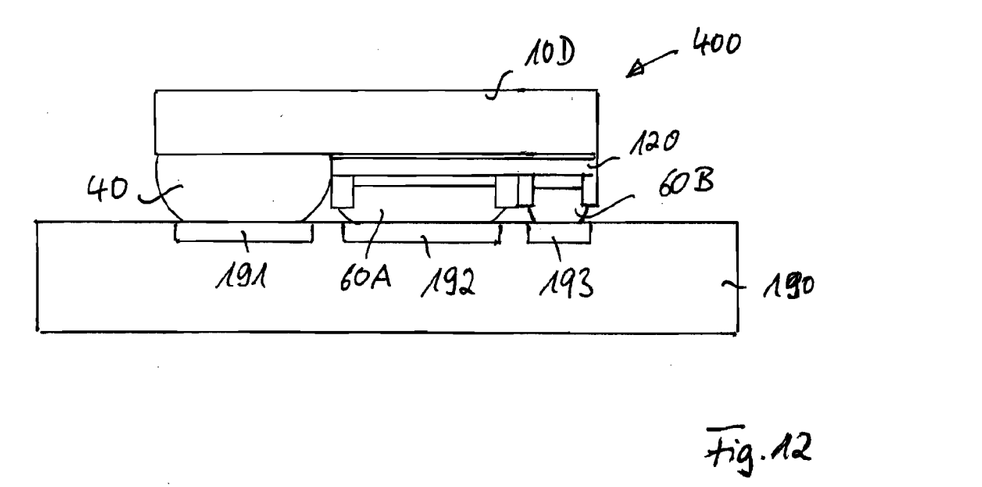
FIG. 12 is a cross-sectional view schematically illustrating the semiconductor device 400 bonded to a substrate.

Semiconductor devices 100, 200, 300, 400, 500, 600 may be processed further by standard methods such as testing, and may then be mounted on a substrate. FIGS. 11 and 12 are cross-sectional illustrations of semiconductor device 100 and semiconductor device 400 when mounted on a substrate 90 and a substrate 190, respectively. The substrates 90 and 190 may each be customer's substrates, which do not form part of the semiconductor devices 100 and 400. The substrates 90, 190 may be of any type, for instance PCBs, laminates, metal coated ceramic substrates etc.

As illustrated in FIG. 11, the substrate 90 may include a first conductor trace 91 and a second conductor trace 92, wherein the first conductor trace 91 is electrically connected to the first bump 40 and the second conductor trace 92 is electrically connected to the second bump 60 of the semiconductor device 100. By way of example, a third conductor trace 93 is arranged at to opposite side of the substrate 90 and is electrically connected to the first conductor trace 91 via a through-connection 94. The current flow through the substrate 90 and the semiconductor device 100 is indicated by an arrow.

Without saying, semiconductor devices 200 and 300 may be mounted in a similar way onto substrate 90.

As illustrated in FIG. 12, the substrate 190 may include a first conductor trace 191, a second conductor trace 192 and a third conductor trace 193. The first conductor trace 191 is electrically connected to the first bump 40, the second conductor trace 192 is electrically connected to the second bump 60A and the third conductor trace 193 is electrically connected to the second bump 60B of the semiconductor device 400. Without saying, semiconductor devices 500 and 600 may be mounted in a similar way onto substrate 190.

Generally, a semiconductor device described herein can have a wide variety of shapes, sizes and terminals. It can be a single-chip device or a multi-chip device, whereby at least one of the chips has a vertical structure and includes at least one (but can also include more) electrode pads at its upper main face. At the lower main face, the unpatterned device carrier 10D is only capable to provide one common electrical connection or potential, so that a (power) transistor such as, for example, semiconductor chip 120 is always mounted face-up on the device carrier 10D, whereas a (power) diode such as, for example, semiconductor chip 20 may be mounted in both orientations (face-down or face-up) on the device carrier 10D.

The semiconductor devices 100, 200, 300, 400, 500, 600 described herein are available at low cost (because of the high number of batch processes involved in manufacturing). Further, they have high heat removal capabilities because both the device carrier 10D connected to the lower main face of the semiconductor chips 20, 120 and the second bumps 60, 60A, 60B connected to the upper main face of the semiconductor chips 20, 120 and to an external circuit may have high thermal conductivities and may thus effectively serve as heat sinks for dissipating the heat generated by the semiconductor chips 20, 120.

Further, it is to be noted that the manufacturing methods described herein are merely exemplary. Numerous other embodiments are contemplated. Generally, the semiconductor devices 100, 200, 300, 400, 500, 600 and other semiconductor devices not described in detail herein can be manufactured individually or as a batch with multiple devices. For instance, during batch manufacturing, a group of semiconductor chips 20, 120 may be simultaneously placed on and secured to the carrier 10, the first and second bumps 40, 60, 60A, 60B for multiple devices can be simultaneously generated, the first and second bumps 40, 60, 60A, 60B may be simultaneously shaped and the encapsulant 80 for multiple devices may be simultaneously formed, if desired.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, comprising:
   providing a carrier;
   attaching a plurality of semiconductor chips to the carrier, the semiconductor chips having a first electrode pad on a first main face and at least a second electrode pad on a second main face opposite to the first main face, whereby the first electrode pad is electrically connected to the carrier;
   forming a plurality of first bumps on the carrier, the first bumps being made of a conductive material;
   forming second bumps on the second electrode pads of the semiconductor chips; and
   singulating the carrier into a plurality of semiconductor devices, wherein each semiconductor device comprises at least one semiconductor chip and one first bump,
   wherein the height of the first bumps over the carrier is greater than the height of the second bumps over the second electrode pads.

2. The method of claim 1, wherein the carrier has a continuous metal surface.

3. The method of claim 1, wherein the carrier is a metal layer or a substrate coated with a continuous metal layer.

4. The method of claim 1, wherein the carrier is planar.

5. The method of claim 1, wherein the carrier has lateral dimensions which, in one or two dimensions, are larger than 0.2 m.

6. The method of claim 1, further comprising attaching multiple rows of semiconductor chips to the carrier.

7. The method of claim 6, further comprising forming multiple rows of first bumps on the carrier.

8. The method of claim 7, further comprising distributing rows of semiconductor chips and rows of first bumps on the carrier in an alternate order.

9. The method of claim 1, wherein forming the first bumps comprises printing the first bumps on the carrier.

10. The method of claim 1, wherein forming the first bumps comprises printing the first bumps on the carrier and forming the second bumps comprises printing the second bumps on the electrode pads by the same printing operation.

11. The method of claim 1, wherein the first bumps are made of a solder material.

12. The method of claim 11, further comprising:
    performing a reflow operation of the first bumps before or after singulating the carrier into a plurality of semiconductor devices.

13. The method of claim 1, further comprising:
    depositing an encapsulant over the semiconductor chip and the carrier, wherein the first bumps protrude through the encapsulant to form exposed terminals of the semiconductor device.

14. The method of claim 1, further comprising:
    depositing an encapsulant over the semiconductor chip and the carrier, wherein the second bumps protrude through the encapsulant to form exposed terminals of the semiconductor device.

15. The method of claim 1, wherein the semiconductor chip is a vertical power diode.

16. The method of claim 1, wherein the semiconductor chip is a vertical power transistor.

17. The method of claim 1, wherein summits of the first bumps and the second bumps are in a plane parallel to a plane defined by the carrier.

18. A method of manufacturing a semiconductor device, comprising:
    providing a carrier;
    attaching a plurality of semiconductor chips to the carrier, the semiconductor chips having a first electrode pad on a first main face and at least a second electrode pad and a peripheral insulating barrier around a perimeter of the second electrode pad on a second main face opposite to the first main face, whereby the first electrode pad is electrically connected to the carrier;
    forming a plurality of first bumps on the carrier, the first bumps being made of a conductive material; and
    singulating the carrier into a plurality of semiconductor devices, wherein each semiconductor device comprises at least one semiconductor chip and one first bump.

* * * * *